US006981190B2

(12) United States Patent
Gupte et al.

(10) Patent No.: US 6,981,190 B2
(45) Date of Patent: Dec. 27, 2005

(54) CONTROLLING THE CONTENT OF SPECIFIC DESIRED MEMORY ELEMENTS WHEN TESTING INTEGRATED CIRCUITS USING SEQUENTIAL SCANNING TECHNIQUES

(75) Inventors: Ajit D. Gupte, Pune (IN); Jais Abraham, Malapurram (IN)

(73) Assignee: Texas Instruments Incorporated, Dallas, TX (US)

( * ) Notice: Subject to any disclaimer, the term of this patent is extended or adjusted under 35 U.S.C. 154(b) by 485 days.

(21) Appl. No.: 10/259,288

(22) Filed: Sep. 30, 2002

(65) Prior Publication Data

US 2004/0064769 A1    Apr. 1, 2004

(51) Int. Cl.[7] ............................................ G01R 31/28
(52) U.S. Cl. ..................... 714/726; 714/724; 714/30
(58) Field of Search ............................. 714/726, 718, 714/699, 100, 25, 30, 32, 37, 40, 48, 724

(56) References Cited

U.S. PATENT DOCUMENTS

| | | | | |
|---|---|---|---|---|
| 4,916,388 A | * | 4/1990 | Sano ......................... | 714/731 |
| 5,974,058 A | * | 10/1999 | Burns et al. ................ | 370/538 |
| 6,145,105 A | * | 11/2000 | Nadeau-Dostie et al. ... | 714/726 |
| 6,763,489 B2 | * | 7/2004 | Nadeau-Dostie et al. ... | 714/731 |
| 2002/0171890 A1 | * | 11/2002 | Lin et al. .................... | 359/124 |

OTHER PUBLICATIONS

Puneet Gupta; Jais Abraham; Rubin A. Parekhji; Entitled: "Improving Path Delay Coverage in Embedded Cores-Methodology and Experiments"; TI India Technical conference 2001; 9 Pages.

* cited by examiner

Primary Examiner—Albert Decady
Assistant Examiner—Dipakkumar Gandhi
(74) Attorney, Agent, or Firm—Abdul Zindani; W. James Brady, III; Frederick J. Telecky, Jr.

(57) ABSTRACT

A launch multiplexor which enables a desired bit to be stored into a desired memory element when using sequential scanning techniques (e.g., automatic test pattern generation (ATPG)). The launch multiplexor may be employed in addition to a scan multiplexor, which enables the test pattern bits or normal operating input to be selected and stored in the desired memory element. The scan multiplexor is used to scan-in a test pattern and evaluate a first input, and the launch multiplexor provides the control to store a desired bit into the corresponding memory element. Another output may be evaluated after storing the desired bit. In an embodiment, launch multiplexors are used associated with only memory elements in the critical paths, and the delay in transitioning from one output to another may be conveniently measured.

8 Claims, 2 Drawing Sheets

CONTROLLING THE CONTENT OF SPECIFIC DESIRED MEMORY ELEMENTS WHEN TESTING INTEGRATED CIRCUITS USING SEQUENTIAL SCANNING TECHNIQUES

BACKGROUND OF THE INVENTION

1. Field of the Invention

The present invention relates to testing of integrated circuits, and more specifically to a method and apparatus for controlling the content of specific desired memory elements when testing integrated circuits using a sequential scanning technique such as Automatic Test Pattern Generation (ATPG).

2. Related Art

Integrated circuits are often tested to verify whether the circuits operate in a desired manner. For example, an integrated circuit may be tested to ensure that each component (within the integrated circuit) generates a desired output in response to corresponding inputs, and such testing is often referred to as functional testing.

Similarly, the delays in various paths of an integrated circuit may be measured to ensure that the paths generate the respective outputs within any time limits as may be necessary for the operation of the integrated circuit at a desired clock frequency, and such testing is often referred to as delay testing.

Sequential scanning techniques are often employed to test integrated circuits. As is well known in the relevant arts, Automatic Test Pattern Generation (ATPG) is an example of such a sequential scanning approach. In a typical scenario, the memory elements (e.g., flip-flops) are connected in sequence, and a desired sequence of bits ("test pattern") is sequentially scanned into the memory elements. The circuit is said to be in a 'initialization mode' when a test pattern is being scanned into the memory elements of the circuit.

An integrated circuit may be switched from the initialization mode to an evaluation mode (referred to as "functional mode" in the relevant arts), and the results generated by various combinatorial logic elements (based on the scanned test pattern) may be stored in the corresponding memory elements. The generated outputs may be examined and the delays in various paths may be measured to verify whether the integrated circuit operates in a desired manner.

It is often desirable to control the content of specific desired memory elements while testing integrated circuits. For example, it may be desirable to use one value for a subject memory element in one time instance of the evaluation mode and another value for the subject memory element in the next time instance, while leaving the content of remaining memory elements unchanged.

Use of such a different value may be desirable, for example, to excite (cause transition along) a specific path of the integrated circuit. Various timing parameters and logic functional operation (e.g., absence of stuck-at condition) may be measured/verified by using such tests. By changing only one bit, and not others which may effect a transition anywhere in a subject path, it may be ensured that the transition is caused only by a memory element connected at one end of the subject path. Accordingly, it may be desirable to control the content of memory elements.

Several prior approaches have been used to control the content of desired memory elements. As an illustration, with reference to the example of previous paragraph, the memory elements are connected in such a sequence that all the memory elements storing one logical value are connected in one direction of the subject memory element, and memory elements with another value are connected in the another direction.

Thus, the test pattern may merely need to be shifted by one position to shift-in a desired bit value into the specific memory element without effectively changing the value in the other memory elements. One problem with such an approach is that the approach imposes (or requires) a specific order in which the memory elements are to be connected, and the corresponding connectivity requirement may pose challenges in layout and routing while designing an integrated circuit. In addition, different tests may require conflicting paths Accordingly, the approach may not be suitable for at least some environments.

In another approach, additional memory element ("dummy memory elements") may be used in the middle of sequence of memory elements, for example, to avoid undesirable changes in values. As an illustration, it is assumed that a transition is desirable in one ("subject memory element") of the sequence of memory elements and such a transition can be attained by a shift operation. Assuming further that such a shift would shift-in a undesired value from the subject memory element to an adjacent memory element, a dummy memory element may be used in between the two elements. The dummy element can be pre-set to a value to ensure that the shift operation does not result in an undesired value in the adjacent memory element.

However, one disadvantage of such an approach is that a large number of memory elements may be required to support, for example, excitation of various paths, and the resulting consumption of space (on the integrated circuit) and power consumption may be unacceptable. Accordingly, what is needed is a method apparatus which enables the content of specific memory elements to be controlled when testing integrated circuits using sequential scanning techniques such as ATPG.

SUMMARY OF THE INVENTION

An aspect of the present invention allows the efficient testing of an integrated circuit containing memory elements. Each memory element contains a data input and an output. The memory elements may be connected sequentially in that the output of each memory element is coupled to a data input of a next memory element (except that the output of the last memory element would not be connected to other memory elements).

A launch multiplexor may be provided associated with a memory element of interest. The launch multiplexor provides the data input of the memory element of interest by selecting either a first input or a second input (in a first or second configuration respectively). The first input is coupled to an output of a previous memory element and the second input is coupled to receive a desired bit.

A control block causes a test pattern to be scanned into the memory elements in a scan mode. Each bit of the test pattern may be provided as a data input of a first memory element in one clock cycle of a scan clock. The control block causes the launch multiplexor to be placed in the first configuration in the scan mode and then causes the launch multiplexor to be placed in the second configuration in a launch cycle, whereby the desired bit is stored in the memory element of interest in the launch cycle. A combinatorial logic may evaluate an output after the test pattern is stored in the memory elements, and an another output in the launch cycle.

Due to the control provided by the launch multiplexor, a desired bit may be stored any time in the corresponding memory element. As a result, a designer is generally provided more flexibility in determining the specific sequence in which to connect the memory elements.

In addition, the launch multiplexor may be employed associated with a memory element in a critical path of the integrated circuit, and a transition can be triggered on the critical path without affecting the content of the other memory elements. The delay in completion of the transition can be measured to ensure that the critical path operates within the timing constraints posed by the normal clocks employed for operation of the integrated circuit.

The integrated circuit may further contain a scan multiplexor associated with each of the memory elements. The scan multiplexor enables the bits of the test pattern to be scanned in sequentially. The scan multiplexor and the launch multiplexor together operate to select one of the test pattern bits in the scan mode and the desired bit in the launch cycle.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawing(s), wherein.

DETAILED DESCRIPTION OF THE PREFERRED EMBODIMENTS

1. Overview and Discussion of the Invention

An aspect of the present invention enables a multiplexor to be associated with a specific memory element, the content of which is sought to be controlled. Thus, when testing an integrated circuit containing the specific memory element using sequential scanning technique, the multiplexor may be used to store the specific desired bit values in the specific memory element. The multiplexor may also enable bits of the test patterns to be stored in the specific memory element. Thus, the output(s) of an integrated circuit may be evaluated using a test pattern, the content of the specific memory element only can be changed, and the output(s) may be evaluated again after changing the content.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Circuit

Figure 1:
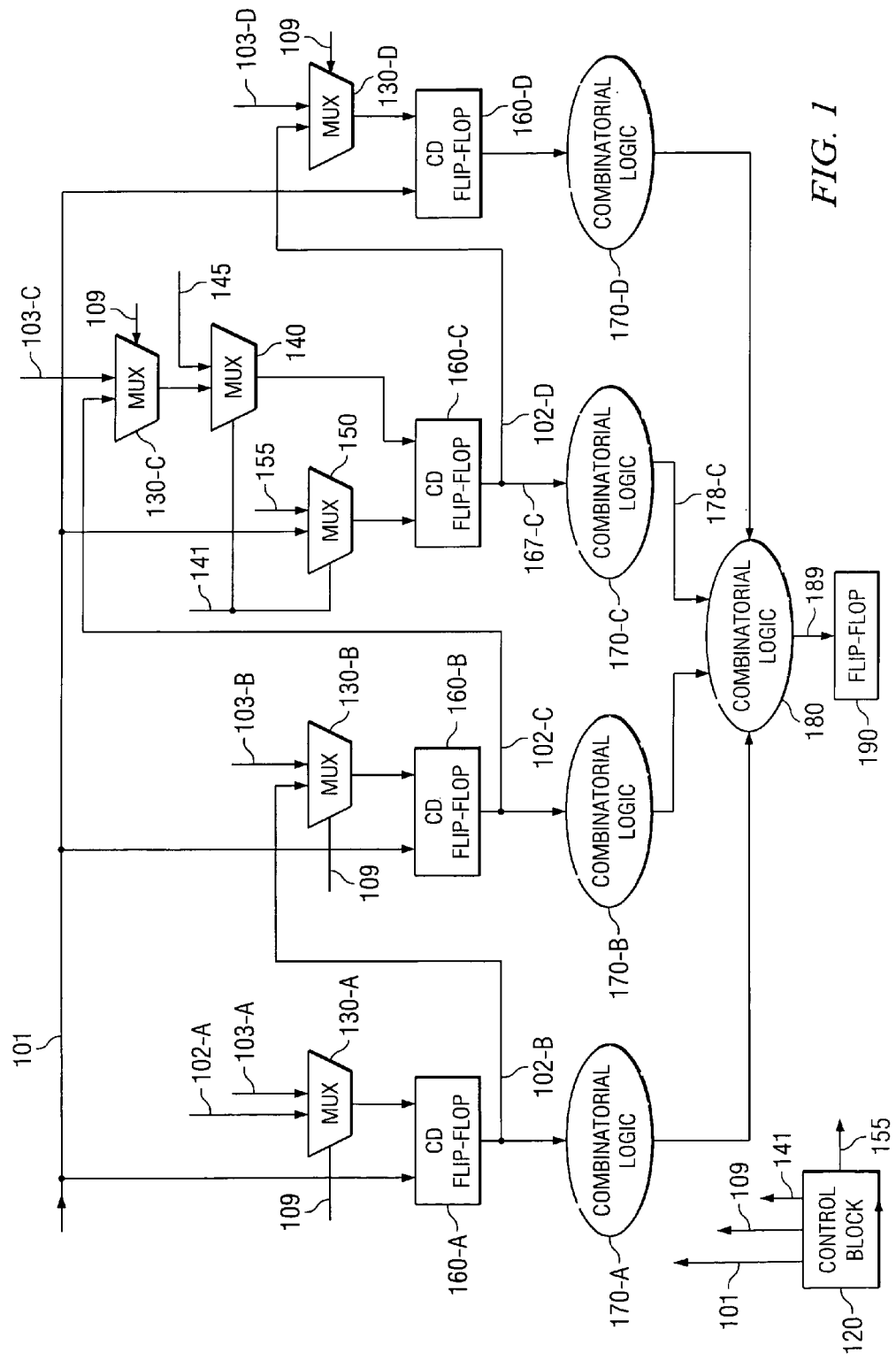
FIG. 1 is a block diagram illustrating an embodiment according to the present invention.
Figure 2:
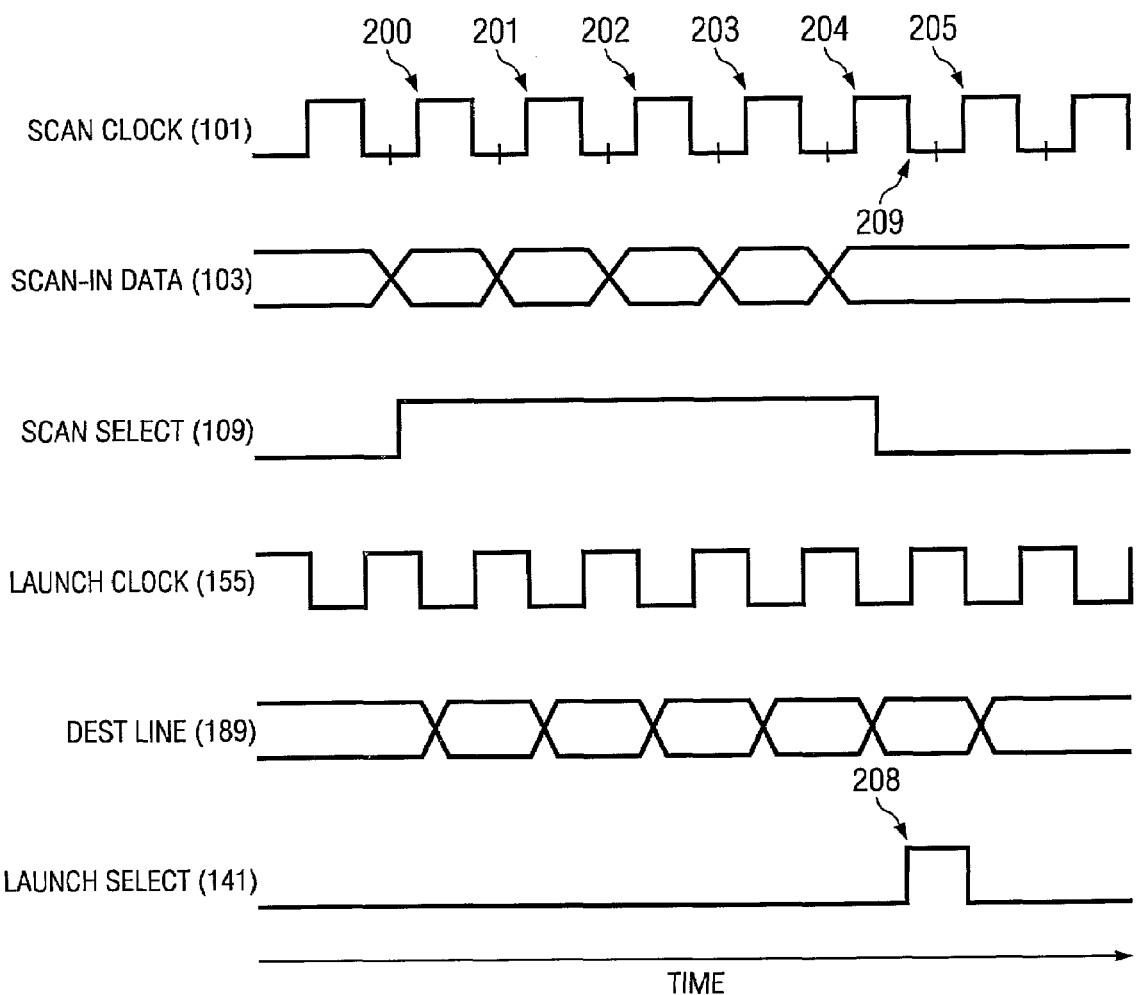
FIG. 2 is a timing diagram illustrating in further detail the operation of an embodiment according to the present invention.

FIG. 1 is a block diagram illustrating an example circuit in which the present invention can be implemented. The circuit is shown containing control block 120, scan multiplexors 130-A through 130-D, launch multiplexor 140, clock multiplexor 150, input flip-flops 160-A through 160-D, combinatorial logics 170-A through 170-D and 180, and target flip-flop 190. Each component is described below in further detail.

Control block 120 coordinates and controls the operation of remaining components by generating the appropriate control signals. Accordingly, control block 120 is shown generating scan clock 101, launch clock 155, scan select signal 109, and launch select signal 141. Scan clock 101 may be used in the regular operation (non-test mode) of the integrated circuit of FIG. 1. The operation and implementation of control block 120 will be clear based on the description of the various signals and components described below.

In general, input flip-flops 160-A through 160-D, combinatorial logics 170-A through 170-D and 180, and target flip-flop 190 together represents the functional part of an example integrated circuit sought to be tested according to various aspects of the present invention. The remaining components scan multiplexors 130-A through 130-D, launch multiplexor 140, clock multiplexor 150 are used to test the functional part.

With respect to the functional part, combinatorial logics 170-A through 170-D respectively receive the bit stored in input flip-flops 160-A through 160-D, and generate a corresponding output bit. Combinatorial logic 180 in turn receives the four output bits and generates a bit, which is stored in target flip-flop 190. While combinatorial logics 170-A through 170-D are shown only with one input for illustration, typical logic circuits contain several more inputs.

With respect to components used to test the functional part, scan multiplexors 130-A through 130-D are generally used to either scan-in a test pattern (in a scan mode) or to store input bits in functional (normal) mode into the corresponding flip-flops 160-A through 160-D. Scan select signal 109 may be asserted to one logical value in the scan mode and to another value in the functional mode.

The bits selected as a result by multiplexors 130-A through 130-D are respectively provided for storing in flip-flops 160-A through 160-D at time points specified by scan clock 101 in the scan mode and when the integrated circuit is provided inputs for regular operation. However, the storing of bits in flip-flop 160-C is eventually controlled by launch multiplexor 140, and the timing of such storing is controlled by clock multiplexor 150 as described below.

Launch multiplexor 140 enables a desired bit to be stored in flip-flop 160-C without having to change the status of the other memory elements. Thus, the desired bit ("launch data") is provided on path 145 and launch select line 141 may be controlled to cause the bit on path 145 to be stored (instead of the output of scan multiplexor 130-C) in input flip-flop 160-C. The manner in which the components of above can be used is described with an example operation below.

3. Example Operation

For illustration, it is assumed a path containing input flip-flop 160-C, line path 167-C, combinatorial logic 170-C, line path 178-C, combinatorial logic 180, line path 189 and destination path 190 forms a 'critical path' (i.e., presents the longest delay among different paths), and thus needs to be measured. The manner in which the delay can be measured is described below.

A first test pattern is first scanned-in sequentially on path 103-A using scan clock 101, while maintaining scan select line 109 at a first logical value (e.g., 0). By maintaining launch select line 141 also at a constant logical value (e.g., 1), the first test pattern is stored in the four input flip-flops 160-A through 160-D in four clock cycles of the scan clock 101. The corresponding first output value is evaluated.

It may now be necessary to change just the bit stored in input flip-flop 160-C to trigger a transition on the entire critical path. The time consumed for the transition to occur can then be measured.

Accordingly, a desired bit value (which is different from the bit value stored when the first test pattern is scanned) is provided as an input on line 145 and launch select line 141 is asserted to another logical value (0) to cause the bit on line 145 to be stored in input flip-flop 160-C. The storage excites the critical path and the time consumed for the transition to be complete in the path may be measured in a known way. The operation of an embodiment of the circuit of FIG. 1 is described in further detail with reference to a timing diagram below.

4. Timing Diagram

FIG. 3 contains a timing diagram illustrating the details of the example operation of above in one embodiment. Scan clock 101 may be chosen to operate at half the frequency of a clock signal which would be used during normal operation of the integrated circuit. Launch clock 155 may be selected with the same frequency as scan clock 101, but 180 degrees out of phase such that the rising edge of one clock cycle coincides with the falling edge of the other.

A test pattern (represented by data bits on scan-in data 103-C) is scanned-in into the four input flip-flops 160-A through 160-D in four clock cycles (of scan clock 101) between time points 200 and 204. The scanning is facilitated as scan select signal 109 is high and the launch select signal 141 is at a low logical level between the two time points at the rising edges of the scan clock. The destination line 189 is shown transitioning slightly after the time points 201 through 204. As may be appreciated, the value on destination line 189 may be clocked into target flip-flop 190.

Launch clock 155 is shown 180 degrees out-of-phase with scan clock 101. In an embodiment, both the clocks have half the normal operating frequency of the integrated circuit. Thus, by operating the two clocks at 180 degrees phase difference, a transition can be triggered with a duration equaling the clock period of the normal clock that would be used to operate the integrated circuit of FIG. 1.

Slightly ahead of time point 209 (the falling edge after time point 204), the launch select signal 141 is raised to a high logical level. The scan select line 109 is lowered as well around the same time point. By providing the desired data bit on path 145 by time point 209, the bit value corresponding to new evaluation may be generated on path 189.

Thus, a first evaluation may occur starting at time point 204 and an immediate evaluation may occur starting at time point 209. Assuming there is a transition is bit values, the start of the transition would occur with a time difference equaling the clock period of the normal operating clock (as scan clock 101 has a frequency of half the normal operating clock). As the transition is assumed to have occurred in a critical path, the delay in completion of transition can be measured.

Accordingly, using the above approach a desired data value may be stored in a specific desired memory element. It may be desirable to minimize the number of additional multiplexors used in controlling the data inputs. Accordingly, a designer may determine the specific paths/memory elements where control is desirable, and implement multiplexors associated with only the corresponding memory elements.

5. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of testing a path in an integrated circuit, said method comprising:

connecting sequentially a plurality of memory elements contained in said integrated circuit, wherein each of said plurality of memory elements comprises a data input and an output, wherein an output of each memory element is coupled to a data input of a next memory element and data_input of each memory element is coupled to one of a plurality of corresponding first multiplexors, the first multiplexor is configured to select a first data input or an output from a previous memory element as said data input for each memory element;

providing a launch multiplexor coupled to the data input of a memory element of interest of said plurality of memory elements and configured to select either an output of the corresponding first multiplexor or a second input as said data input of the memory element of interest, wherein said launch multiplexor selects said output of the corresponding first multiplexor in a first configuration and the second input in a second configuration;

scanning in sequentially a test pattern into said plurality of memory elements, wherein said test pattern comprises a plurality of bits, wherein said scanning is performed by providing each of said plurality of bits in a consecutive clock cycle on said data input of a first memory element, wherein said first memory element is comprised in said plurality of memory elements, wherein said launch multiplexor is placed in said first configuration when said scanning is performed;

evaluating an output of said integrated circuit using said test pattern;

storing a desired bit in said memory element of interest by providing said desired bit as said second input to said launch multiplexor and placing said launch multiplexor in said second configuration; and evaluating another output of said integrated circuit after said storing.

2. The method of claim 1, wherein said connecting and scanning are comprised in automatic test pattern generation (ATPG) approach.

3. The method of claim 1, further comprising measuring a delay in the transitioning of a path from said output to said another output.

4. The method of claim 3, wherein said path comprises a critical path in said integrated circuit.

5. An integrated circuit comprising:

a plurality of memory elements including a memory element of interest, wherein each of said plurality of memory elements comprises a data input and an output, wherein an output of each memory element is coupled to a data input of a next memory element;

a plurality of input multiplexors being coupled to provide said data input of a corresponding one of said plurality of memory elements, each of said plurality of input multiplexors selecting either an output from a previous memory element or a normal input used during regular operation of said integrated circuit;

a launch multiplexor coupled to said memory element of interest and configured to select either an output of the corresponding input multiplexor or a first input as said data input of said memory element of interest, wherein said launch multiplexor selects the output of the corresponding input multiplexor in a first configuration and the first input in a second configuration, wherein said the output of the corresponding input multiplexor is coupled to an output of a previous memory element and said first input is coupled to receive a desired bit;

a control block to cause a plurality of bits forming a test pattern to be scanned into said plurality of memory elements in a scan mode, wherein said scanning is performed by providing each of said plurality of bits in a consecutive clock cycle on said data input of a first one of said plurality of memory elements, wherein said control block causes said launch multiplexor to be placed in said first configuration in said scan mode and then causes said launch multiplexor to be placed in said second configuration in a launch cycle, whereby said desired bit is stored in said memory element of interest in said launch cycle; and a combinatorial logic to evaluate an output after said test pattern is stored in said plurality of memory elements during said scan mode, and an another output in said launch cycle.

6. The integrated circuit of claim 5, wherein said input multiplexor and said launch multiplexor are integrated as one multiplexor for said memory element of interest.

7. The integrated circuit of claim 5, wherein said test pattern is scanned in using a scan clock and said launch cycle is determined by a launch clock, wherein said scan clock is out-of-phase with said launch clock by 180 degrees.

8. The integrated circuit of claim 7, further comprising a clock multiplexor selecting either said launch clock or said scan clock, an output of said clock multiplexor being coupled to said memory element of interest.

* * * * *